(12) United States Patent
Foreman et al.

(10) Patent No.: US 9,880,317 B2
(45) Date of Patent: Jan. 30, 2018

(54) SUPERCONDUCTING ACCELERATION SENSOR SUITABLE FOR GRAVITATIONAL WAVE RADIATION DETECTION

(71) Applicants: Joe Foreman, Alexandria, VA (US); Armen Gulian, Ashton, MD (US); Louis Sica, Jr., Alexandria, VA (US); Vahan R. Nikoghosyan, Ashtarak (AM); Shmuel Nussinov, Kensington, MD (US); Jeff Tollaksen, Laguna Beach, CA (US)

(72) Inventors: Joe Foreman, Alexandria, VA (US); Armen Gulian, Ashton, MD (US); Louis Sica, Jr., Alexandria, VA (US); Vahan R. Nikoghosyan, Ashtarak (AM); Shmuel Nussinov, Kensington, MD (US); Jeff Tollaksen, Laguna Beach, CA (US)

( * ) Notice: Subject to any disclaimer, the term of this patent is extended or adjusted under 35 U.S.C. 154(b) by 936 days.

(21) Appl. No.: 14/076,585

(22) Filed: Nov. 11, 2013

(65) Prior Publication Data

US 2015/0128696 A1    May 14, 2015

(51) Int. Cl.
*G01V 7/00*     (2006.01)
*G01R 33/035*   (2006.01)
*G01C 19/58*    (2006.01)
*G01P 15/08*    (2006.01)

(52) U.S. Cl.
CPC ............... *G01V 7/00* (2013.01); *G01C 19/58* (2013.01); *G01P 15/08* (2013.01); *G01R 33/0354* (2013.01)

(58) Field of Classification Search
CPC .................................. G01V 7/00; G01C 19/58
USPC ................................................ 73/514.16, 383
See application file for complete search history.

(56) References Cited

U.S. PATENT DOCUMENTS

| 2011/0065585 A1* | 3/2011 | Lanting | G01R 33/0354 505/162 |
| 2011/0089405 A1* | 4/2011 | Ladizinsky | B82Y 10/00 257/31 |
| 2011/0285393 A1* | 11/2011 | Zakosarenko | G01R 33/035 324/248 |
| 2011/0301039 A1* | 12/2011 | Johnson | B82Y 30/00 505/100 |

\* cited by examiner

*Primary Examiner* — Lisa Caputo
*Assistant Examiner* — Tarun Sinha

(57) ABSTRACT

This invention detects mass and mass motion of external objects by virtue of its action as a gravimeter, gravity gradiometer, and detector of gravitational fields. This invention is for devices which function as accelerometers and gyroscopes for the bodies to which they are attached.

6 Claims, 19 Drawing Sheets

| Z | Element | Atomic Weight | Ionic mass $M_z$ (kg) | Approximate Young's Modulus $Y_z$ (Gpa) |
|---|---|---|---|---|
| 13 | Al | 26.9 | $4.5\ 10^{-26}$ | 69 |
| 23 | V | 50.9 | $8.5\ 10^{-26}$ | 126 - 129 |
| 29 | Cu | 63.5 | $1.0\ 10^{-25}$ | 110 - 117 |
| 82 | Pb | 207 | $3.4\ 10^{-25}$ | 18 |

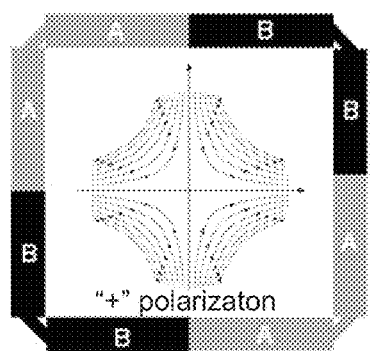 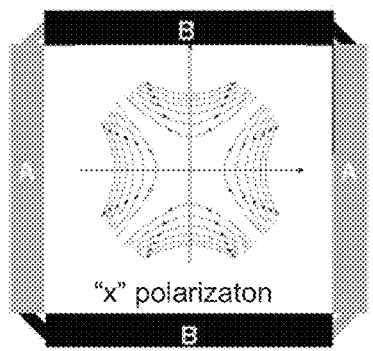
FIG. 21A  FIG. 21B
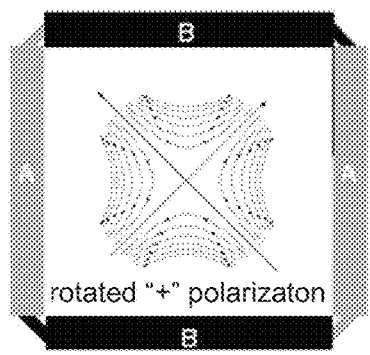
FIG. 21C

SUPERCONDUCTING ACCELERATION SENSOR SUITABLE FOR GRAVITATIONAL WAVE RADIATION DETECTION

CROSS-REFERENCE TO RELATED APPLICATIONS

This application claims the benefit of U.S. Provisional Application 61/877,261 filed Sep. 12, 2013 and the benefit of U.S. Provisional Application 61/796,420 filed Nov. 10, 2012, the respective disclosures of which are incorporated herein by reference.

BACKGROUND

The present invention relates to acceleration sensing and, more particularly, acceleration sensors utilizing superconducting (SC) materials operating at cryogenic temperatures and useful, for example, for sensing acceleration caused by movement of the sensor relative to its surroundings and for sensing accelerations associated with the detection of gravitational fields and gravitational waves.

SUMMARY

Electrons, including normal (non-superconducting) electrons and superconducting (SC) electrons, have a measurable mobility attribute in vacuum and in media (including non-SC and SC media). Measurement of the charge attributes (e.g., charge accumulation, charge distribution, and motion of charge) and the magnetic fields produced by the SC electrons in SC media include measurement of non-uniform quantum mechanical phases of the SC electrons and currents including SC Cooper-pair currents. A detection or measurement system for the charge attributes may include well-known standard devices such as SQUIDS, Josephson junctions, electromagnetic radiation detectors (the radiation results from the motion of charges), and magnetic-field measurement devices. A detection or measurement system may also include the probing of the mobile charge containing/conducting system with magnetic fields or charges and currents (both DC and AC) and deliberately moving the charge containing/conducting system (including rotation thereof about an axis or orbiting thereof about an axis) or measurement device to augment and/or enhance the charge situation or magnetic field measurements.

The present invention relates to instrumentation that functions as accelerometers, gravity meters, gravity gradiometers, gravitational wave detectors, and gravitational field detectors or sensors and which employ superconducting elements as well as those which employ no superconductivity, but, instead, employ cooled and superconducting elements to achieve improve sensitivity.

The present invention also relates to devices which detect electric fields and shifts in charge in structures and currents within and between different structures. The basic structures or element of these instruments are bars (rods, wires, longitudinally extending cylinders, or other configurations) which, when accelerated or being acted upon by a gravitational field, are distorted (compressed or stretched) sufficiently to effect a charge redistribution. FIG. 1 illustrates two simple charge distribution states in conductive rods $A_1$ and $A_2$, both of which are aligned in the local gravity field. In rod $A_1$, the positive charge is upward; in rod $A_2$, the positive charge is downward. An unchanged or nearly unchanged charge distribution and non-isotropic charge distribution state is also possible.

The present disclosure presents ways to detect the above-described charge distribution and any redistribution thereof as a result of the g-fields and changing g-fields. As explained in more detail below, the conducting bars $A_1$ and $A_2$ are connected by a wire and a switch at the top and another wire and switch at the bottom to create a closed shunting circuit that allows observation of the current or changes in current therein. Additionally, electric field sensing devices can be used to detect charge redistribution(s) within the device without the need to place the bars in a shunt circuit configuration.

FIG. 2 shows how charge is distributed in a conductive metallic rod at rest in the gravity field. The gravity field causes the lower portions of the rod to undergo axially compression relative to the upper portion of the rod; thus, gravity causes a density gradient in the rod that increases toward the bottom end of the rod. For many metallic conductors, this gravity-induced inhomogeneous deformation of the lattice creates a chemical-potential gradient, which redistributes the mobile electrons toward and to the top of the rod, as shown in FIG. 2. As a consequence, the conductive metallic rod accumulates a negative charge on the top and a positive charge on the bottom. This charge distribution has been described by Dessler (Dessler et al 1968) and confirmed experimentally by Beams (Beams 1968). The same redistribution of charge occurs if the rod is suspended by a non-conductive strand from above, since it is the gradient of the density of the material which causes the charge redistribution.

If two different materials, A and B, are used for the rods, one may obtain a difference in E-field between the two different-material rods; FIG. 3 shows the basic difference in charge distribution in two different rods of two different materials, A and B.

As shown in FIG. 4, the simplest way of detecting the difference is charge distribution is to connect the rods via switches in a parallel-circuit organization so that each rod shunts (i.e., shorts-out) the other rod. When both switches are closed, a current transients will flow through the current sensing device I, which can include a superconducting SQUID sensor and its related circuitry.

After the initial pulse of current, the charge will redistribute itself between the rods and the charge within the lattice structure of each rod with also redistribute. The momentary current spike is related to the charge distribution which is related to g; thus, measurements of the E-field may also be used to determine g and time-varying changes thereof.

When used as an accelerometer, the apparatus in FIG. 4 will be sensitive to motion of the detector circuit along an axis when the switches closed. Similarly, the detector circuit will be sensitive to the motion of a massive object moving in one direction or the other along a sensing axis. Further, the detector circuit will be sensitive to gravitational waves. A three axis (or more) detector "cluster" may be used to detect changes in the g-field in three orthogonal directions.

The basic elements may be used in several winding configurations and circuits both stationary and rotating or moving. Other circuit elements such as voltage sources may be added as needed. Further, piezoelectric elements may be used.

The electric field in the conductor is given by (Dessler et al 1968)

$$E = -\alpha Mg/e + m_e g/e \tag{1}$$

where $\alpha$ is a dimensionless number approximately between 0.1 and 1.0 and depends on the material, M is the ion mass of the lattice, g is the gravitational acceleration, e is the charge on an electron, and $m_e$ is the mass of an electron. Since $M \gg m_e$ we have from Eq (1).

$$E \approx -\alpha M g/e \quad (2)$$

For copper $\alpha \approx 1/7$, and $$E_{Cu} \approx 10^{-6} \text{Volt/meter} \quad (3)$$

FIG. 5 presents the values of pertinent parameters for several example conductors.

Adler, in a paper in Nature (Adler 1976), disclosed this phenomenon for detection of gravitational waves, where Adler's conductors were many kilometers in length and advocated superconductors only for noise reduction.

The total compression of a rod will be given by $$\Delta L = \rho g L^2/(2Y) \quad (4)$$

and the work done in deforming the rod is given by $$W = \rho^2 g^2 S L^3/(6Y) \quad (5)$$

where $\rho$ is the density, S is the cross sectional area, L is the length, and Y is Young's modulus of the rod.

Using the table shown in FIG. 5, the values of ionic mass and Young's modulus for vanadium and lead indicates that these metals could provide a considerable difference in electric field and difference in charge distribution under the action of a gravitational field and thus be suitable elements for a sensing device. Furthermore, both of these elements become superconducting at sufficiently high temperature.

Experimental results indicate that for the rod in FIG. 2, the energy of deformation in the rod is being transformed into electronic motion which results in the charge distribution shown therein. Rather than moving down, the electrons move up as a result of the ionic compression. The upward force on the electrons is much greater than the direct gravitational force on the electrons, and constitutes energy transfer from the lattice to electrons as shown in FIG. 2. When the circuit is closed (FIG. 4), some of the deformation energy is transferred into electric current; if the material is superconducting, this current will persist.

If all of the deformation energy of one conductor as given by Eq. (4) were converted into current, the current would be:

$$I = e(2WnS/(m_e L))^{1/2} \quad (6)$$

where n is number density of electrons. Substituting the value for deformation energy into Eq (6), this current is:

$$I = e M_{Tot} g(n/(3Y m_e))^{1/2} \quad (7)$$

where $M_{Tot}$ is the mass of the rod.

As an example, consider a Copper wire with diameter 0.1 micron and L=1 meter. The deformation energy is $10^{-16}$ joule. Even if 1 percent of this energy is converted into current, the initial current, for a configuration shown in FIG. 4, will be approximately 10 microampere. This will be somewhat reduced because the conductor on the left will resist this current, but current at this level is easily detectable. For much smaller values of g, or changes in g, multiple loops could be used as shown in the figures below (for example a toroidal winding or other winding may employ many thousands of loops). Copper was used here because a accurate value $\alpha$ for Copper is known since copper cannot become superconducting, other suitable materials are available.

An example of a basic single-axis accelerometer is presented in FIG. 6 and is designated generally by the reference character 10. As shown, the accelerometer 10 is shown as a loop 12 of a superconducting wire (or foil strips) of length L and width W. Current detector D1 is shown at the lower right of the loop 12 and, if desired, a second or further detectors, such as detector D2, located within the loop 12, can be used. Detector D1 senses any magnetic field immediately proximate the adjacent superconductor pathway while the second detector D2 detects any magnetic field developed by the loop 12. The detector or detectors are preferably of the SQUID type that measure magnetic fields. As is well-known, SQUID detectors in their simplest form include a closed superconducting path (typically, cryogenically cooled niobium having a plurality of Josephson junctions) cooperating with a pick-up coil that provides an output signal to a signal processing pathway. In FIG. 6, the accelerometer 10 detects acceleration parallel to the longer sides L. The superconducting pathway on the left (dotted-line illustration) is fabricated in bar or wire form of a first superconducting material SC1 having cross-sectional area S and, in a similar manner, the superconducting pathway on the right (solid-line illustration) is fabricated in bar or wire from of second superconducting material SC2, also having a cross-sectional area S. In an exemplary embodiment, tin (Sn) and lead (Pb) are suitable for use as the superconducting materials. The electrons in the superconductor materials SC1 and SC2 have respective effective masses $m_{eff1}$ and $m_{eff2}$ (assuming that effective masses are different than bare masses). The Cooper-pair number density of the superconducting electrons for the respective first and second superconductors are $n_1^s$ and $n_2^s$ and, in this example, $n_1^s < n_2^s$. While not shown in FIG. 6, the left and right superconducting pathways are attached to or formed on an underlying dielectric (i.e., non-conducting) substrate, as represented by the substrate 16 in FIG. 8. While the left and right superconducting pathways of the bi-SC loop 10 are shown as of equal path-length, some applications may use non-equal path-lengths.

The left and right superconducting pathways can be formed by thin-film techniques in which the different materials are deposited on a non-conducting, dielectric substrate 16 (FIG. 8) by sputtering, plasma deposition, chemical vapor deposition, atomic layer deposition, etc. with the ends of the different superconductor pathways overlapped or otherwise connected to form a closed current-conducting loop. If desired, thick-film techniques can be use in which pre-cursor materials are applied to the substrate and heated to form the desired pathway pattern. In some cases, thin foils fabricated from appropriate superconductor materials can be attached or adhered to the substrate to form the loop 12, and, for elemental superconductors, atomic layer deposition (ALD) techniques are suitable.

FIG. 7 illustrates that the size and shape of the superconducting pathway can be different from that shown in FIG. 6, such as the curved pathways shown, depending upon the particular application.

FIG. 8 shows the detector mounted to the substrate 16 or mounting plate. In that case where the arrangement of FIG. 8 is in alignment with the local gravity vector, changes in gravitational acceleration are subject to detection and, where the arrangement of FIG. 8 is accelerating relative to its surroundings, the acceleration is likewise subject to detection. In FIG. 8, the acceleration of the electrons is in the clockwise direction so the rate of change of the current is in the counterclockwise direction, as shown.

FIG. 9 represents an equivalent circuit for the configuration of FIG. 6, while FIG. 10 represents an equivalent circuit for to coupled sensing loops as shown in FIG. 11A.

The sensing devices consistent with the present invention have a number of practical applications including use as a rate gyro. Rotational motion of the SC loop will create a circular current that is caused by the absence of friction between the ionic lattice and the Cooper pairs. Moreover, if the wire diameter is chosen to be about the London penetration depth, then the Meissner effect will not zero the effect of Cooper pair motion delaying vs. the lattice motion. The overall situation corresponds to the London momentum of rotating superconducting bodies which was described as a gyroscope.

Other uses for the superconducting devices consistent with the invention include gravitational wave detection, as described below.

BRIEF DESCRIPTION OF THE DRAWING

FIGS. 21A, 21B, and 21C presents configurations incorporating the principles of the present invention as antenna structures for detecting gravitational waves;

DESCRIPTION

Figures 12A, 12B, 12C:
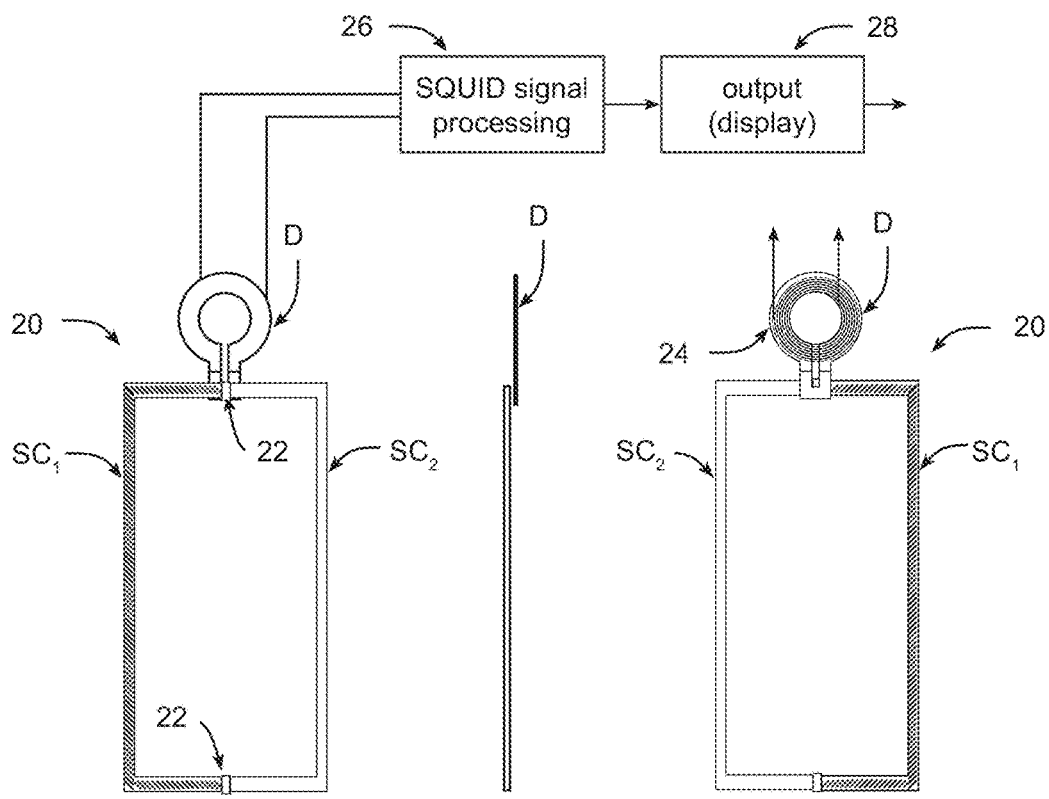
FIGS. 12A, 12B, and 12C are respective front, side, and rear views of a single superconducting loop device showing an exemplary processing path.

A single bi-loop device 20 is shown in respective front, side, and rear views in FIGS. 12A, 12B, and 12C. As shown, the left side of the loop device 20 in FIG. 12A is fabricated from a first superconductor SC1 (e.g., tin), as represented by the hash marks, and the right side is fabricated from a second superconductor SC2 (e.g., lead) with ends of the two different materials joined at 22, for example, by overlapping the two materials. The SQUID detector D is of the classic "washer" profile with a downwardly extending tab (unnumbered, best shown in FIG. 12C). As shown in the side view of FIG. 12B, the downwardly extending tab is positioned behind the loop 20. The detector D includes a pick-up coil 24 that supplies a sensed electrical value to a signal processing unit 26 which provides an output to a suitable device, such as a display 28. SQUID detector systems are well-known commercially available devices and typically include an integrated cryogenic cooling system (not shown) and program-controlled computer processing pathways. While SQUID detector systems are presently preferred, other systems using different technologies may be equally suitable.

Figures 13A, 13B, 13C:
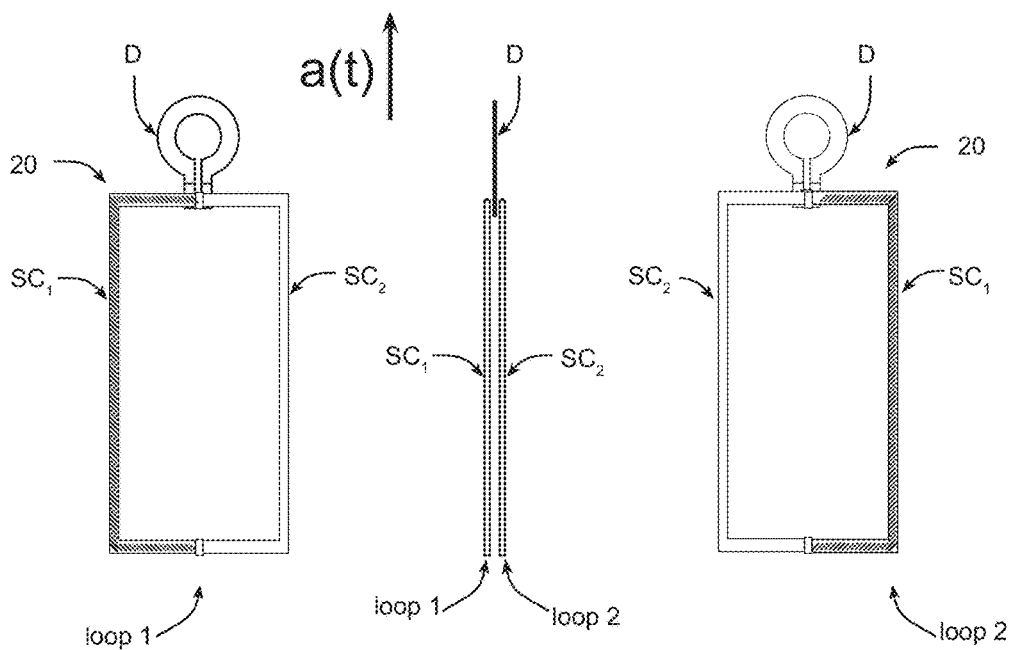
FIGS. 13A, 13B, and 13C are respective front, side, and rear views of a dual superconducting loop device.

A dual bi-loop device 30 is shown in respective front, side, and rear views in FIGS. 13A, 13B, and 13C. As shown, loop 1 is fabricated in the same manner as that of FIG. 13A and a second similarly fabricated loop, loop 2, is positioned behind the loop 1 with the superconductor SC1 in substantial registration or alignment with the superconductor SC2 of the second loop, loop 2. As shown in FIG. 13B, the tab of the detector D is positioned between the two loops.

In the embodiments of FIGS. 12A-12C and 13A-13C, the superconducting pathways can be formed by thin-film techniques in which the different materials are deposited on a non-conducting, dielectric substrate by sputtering, plasma vapor deposition, chemical vapor deposition, etc. with the ends of the different superconductor pathways overlapped or otherwise connected to form a closed current-conducting loop. If desired, thick-film techniques can be use in which pre-cursor materials are applied to the substrate and heated to form the desired pathway pattern. In some cases, thin-foils fabricated from appropriate superconductor materials can be attached or adhered to the substrate, and, in other cases, elemental superconductors can be deposited by atomic layer deposition techniques (ALD).

Figures 14A, 14B:
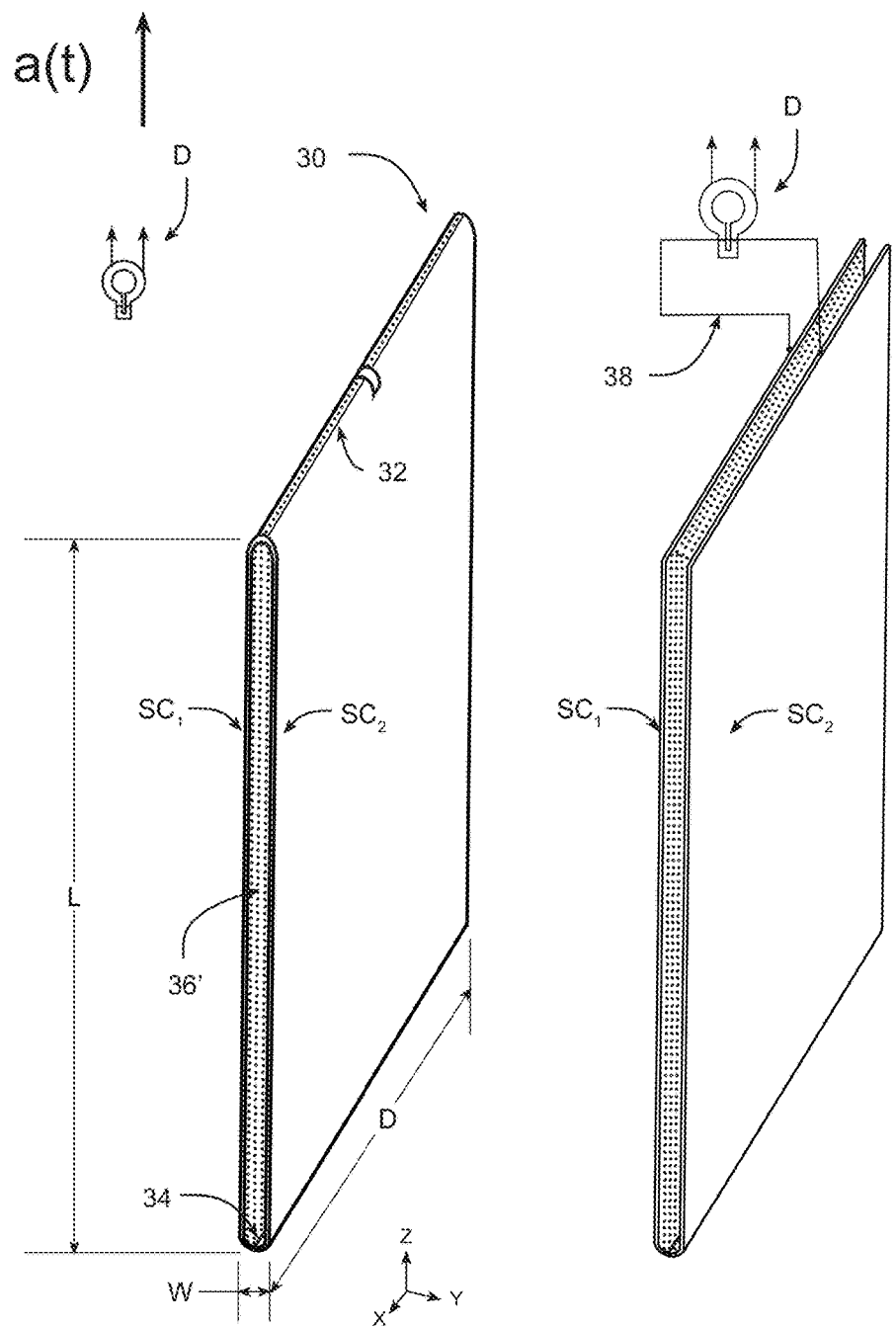
FIG. 14A is isometric view of a single superconducting device have a substantial depth dimension relative to its length and width dimensions.
FIG. 14B is a variant of the configuration shown in FIG. 14A.

A loop-type device having a substantial depth dimension is shown in perspective view in FIG. 14A and designated generally therein by the reference character 30. As shown, a sheet-like structure having the profile shown is fabricated from a first superconductor SC1 (as indicated by the dot pattern) and a second sheet-like structure is fabricated from a second superconductor and joined along seam lines 32 and 34 at the top and bottom to create a relatively narrow loop-like profile with a relatively substantial depth dimension. A slot 36 is formed in the upper portion of the device 30 for receiving the sense-tab of the detector D. As indicated at 36' in FIG. 14A, the sense tab of the detector D can also be inserted into the open space between the two superconductors.

Figure 1:
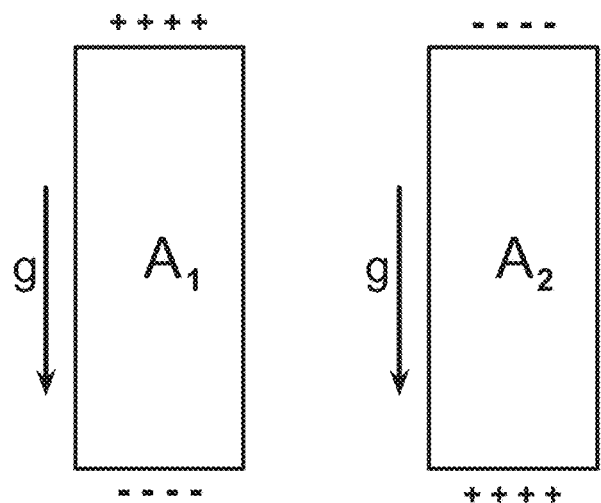
FIG. 1 illustrates two simple charge distribution states in conductive rods, both of which are aligned in the local gravity field.
Figure 2:
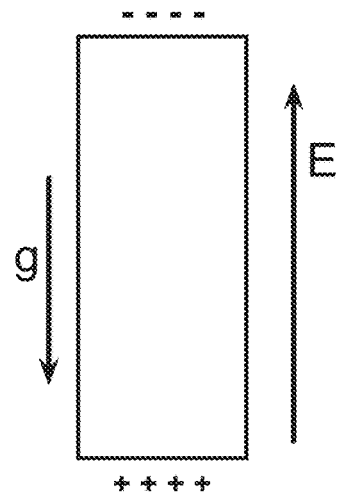
FIG. 2 illustrates charge distribution in a conductive metallic rod at rest in the gravity field.
Figure 3:
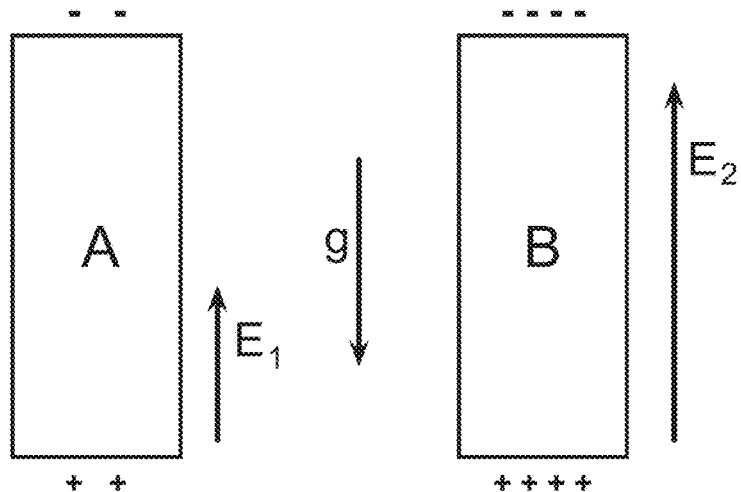
FIG. 3 shows the basic difference in charge distribution in two different rods of two different materials.
Figures 4, 5:
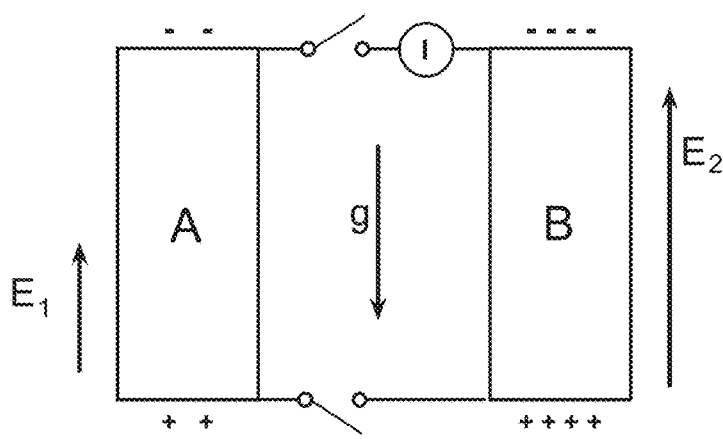
FIG. 4 illustrates the rods of FIG. 3 in a shunting circuit.
FIG. 5 presents the values of pertinent parameters for several example conductors.

FIG. 14B illustrates a variant of the configuration of FIG. 14A; as shown, the upper edges of each superconductor sheet, SC1 and SC2, are connected by a conductor 38 with the detector D positioned in magnetic proximity thereto. If desired, the a transient response similar to that discussed above with respect to FIG. 4 and be obtained by placing a selectively operate switch in the conductor 38.

Figure 15:
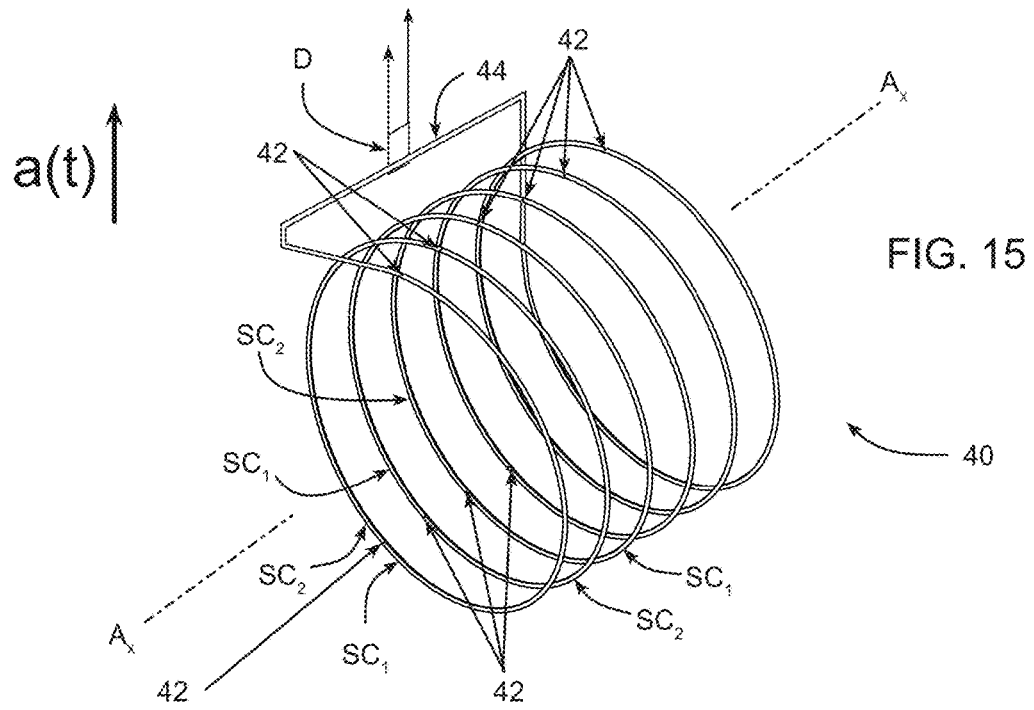
FIG. 15 is perspective view of a helically extending superconducting coil.

FIG. 15 illustrates a device in the form of a wire (or foil strip) helically wound about a longitudinally extending axis $A_x$ and designated generally by the reference character 40 therein. While the helix is shown with six flights, the helix is extendible along the X axis and its diameter and interflight spacing can be changed for varied. The device 40 is formed from a linearly extending wire (or foil strip) having alternating segments of a selected length of the first superconductor SC1 and selected lengths of the second superconductor SC2; the multi-segment wire is then formed into a helix of selected diameter and interflight spacing for as many flights as desired with the junctions 42 between each alternating segment forming one-half of a flight. As shown at the top of the helix of FIG. 15, the various junctions 42 align with one another, as do the junctions 42 at the bottom of the helix. When viewed in side elevation, the flights alternate between the first superconductor SC1 and the second superconductor SC2. The opposite ends of the helix are connected by a superconducting segment 44 with the detector 44 (shown in schematic form) located in magnetic proximity thereto.

Figure 16:
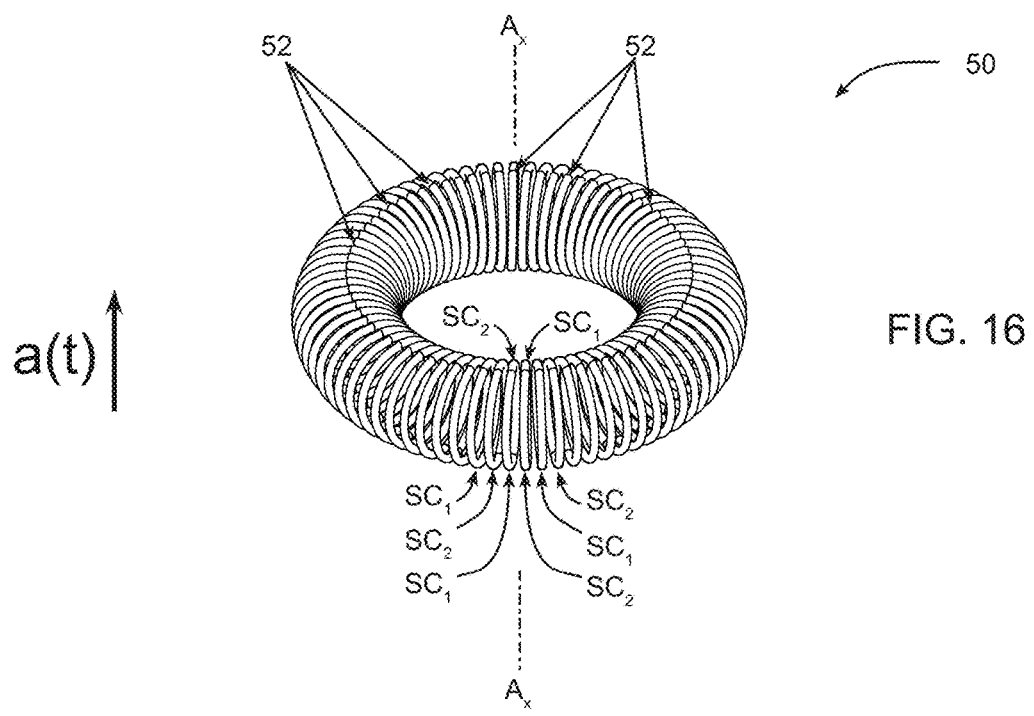
FIG. 16 is perspective view of a helically extending superconducting coil configured as a toroid.

FIG. 16 illustrates a variant of the axially extending helix of FIG. 15. In FIG. 16, the device 50 is formed as a wire (or foil strip) helically wound about a circular toroidal axis with a selected diameter and interflight spacing. The device 50 is formed from a linearly extending wire (or foil strip) having alternating segments of a selected length of the first superconductor SC1 and selected lengths of the second superconductor SC2; the multi-segment wire is then formed into a helix of selected diameter and interflight spacing along the circular toroidal axis with the junctions 52 between each alternating segment forming one-half of a flight. As shown at the top of the helix of FIG. 16, the various junctions 42 align with one another along a circular path, as do the junctions at the bottom of the toroidal helix (not shown). When viewed in side elevation, the flights alternate between the first superconductor SC1 and the second superconductor SC2. The opposite ends of the helix are connected together with the detector D (not shown) inserted between any two flights in magnetic proximity thereto.

Figure 17A:
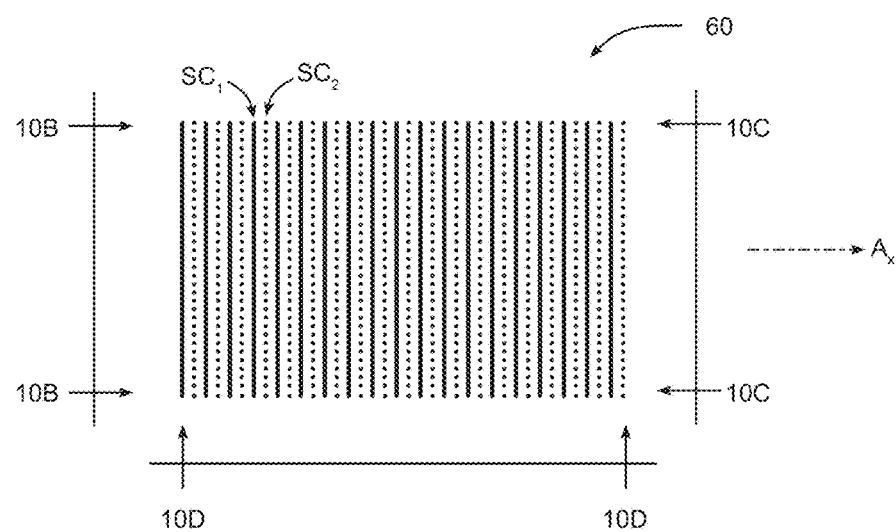
FIGS. 17A, 17B, 17C, 17D, and 17E present a multi bi-loop superconducting arrangement.
Figures 17B, 17C, 17D:
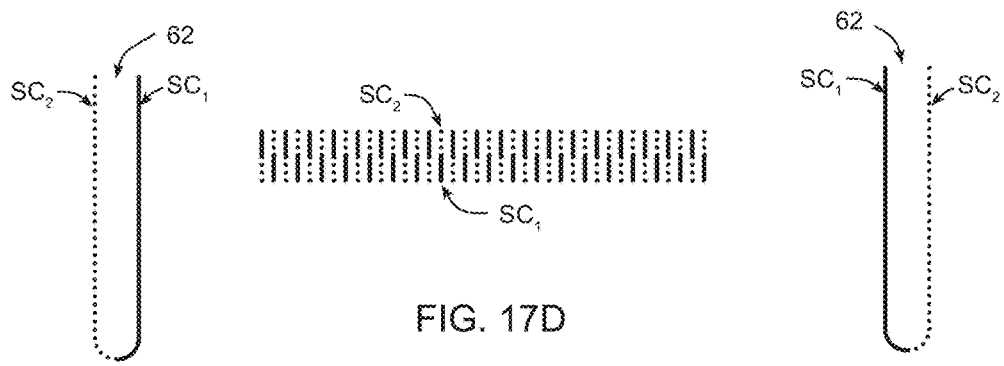

FIGS. 17A-17D illustrate a further design for the device, as indicated by the reference character 60. A shown in the elevational view of FIG. 17A, the device 60 consists of a plurality of alternating wires (or foil strips) of the first superconducting material SC1 (dotted-line illustration) and the second superconducting material SC2 (solid-line illustration) to define sub-components 62. As shown in FIGS. 17B and 17C, a wire (or foil strip) of the first superconducting material SC1 (dotted-line illustration) and the second superconducting material SC2 (solid-line illustration) are joined at their respective lower ends, as shown to form a sub-component 62. The various sub-components 62 are aligned in substantial registration with each other along the linearly extending axis $A_x$ in an alternating interdigitated fashion as shown in FIG. 17D.

Figure 17E:
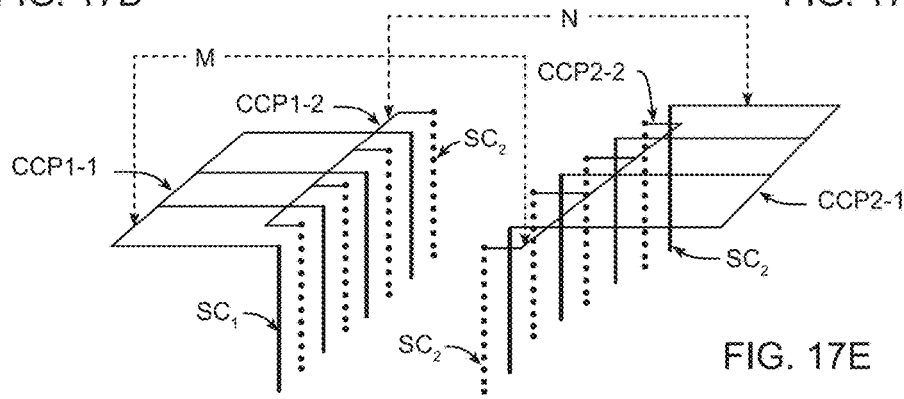
Figure 18:
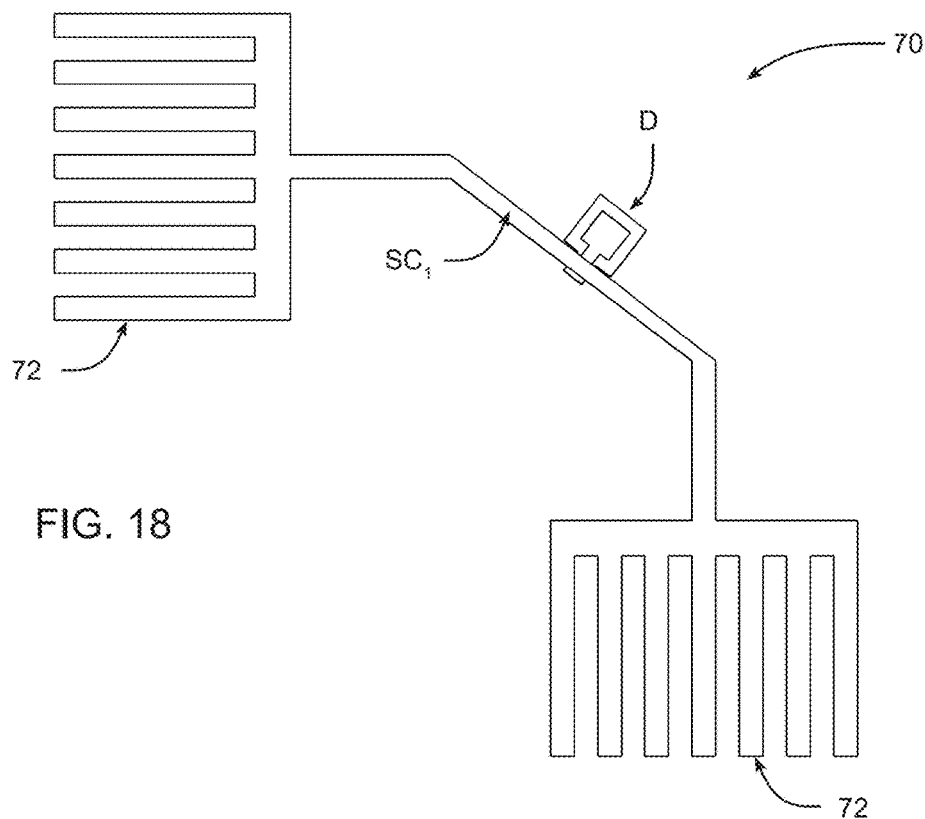
FIGS. 18 and 19 represent a further configuration.

The upper ends of the various sub-components 62 are connected as shown in FIG. 17E. On the left in FIG. 17E, the upper ends of all the first superconductor materials SC1 are connected together along a common connection path CCP1-1 and, on the left in FIG. 17E, the upper ends of all the second superconductor materials SC2 are connected together along a common connection path CCP1-2. In a similar manner and on the right side of FIG. 17E, the upper ends of all the first superconductor materials SC1 are connected together along a common connection path CCP1-2 and the upper ends of all the second superconductor materials SC2 are connected together along a common connection path CCP2-2. The common connection path CCP1-1 is electrically connected to the common connection path CCP2-2 via the path "M", and, in a similar manner, the common connection path CCP1-2 is electrically connected to the common connection path CCP2-1 via the path "N". The detector (not shown) can be positioned in magnetic proximity to any on of the current carrying paths.

Figure 19:
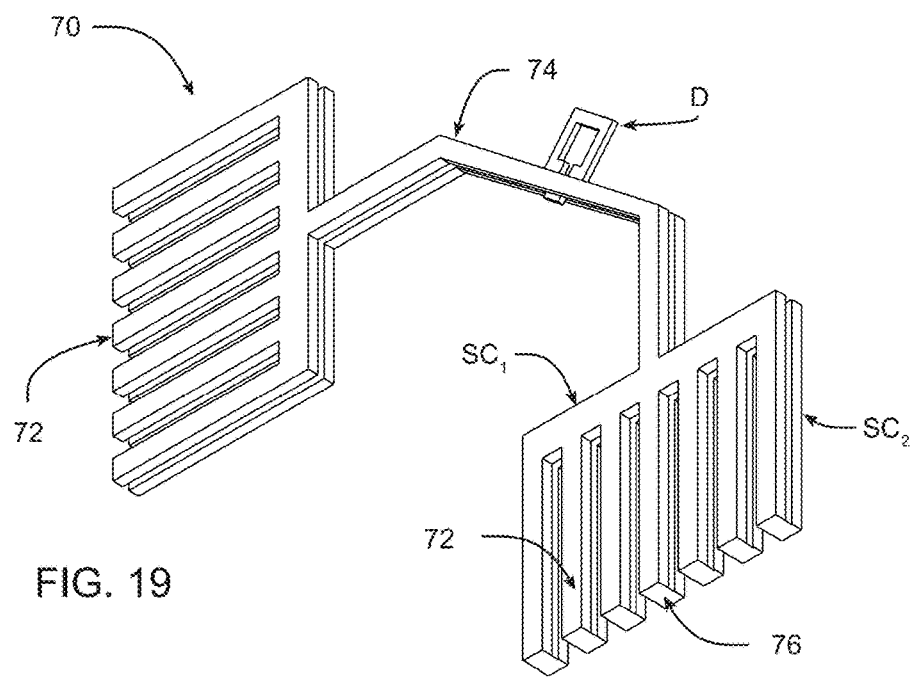

FIGS. 18, 19, and FIGS. 20A-20D illustrate a further variant of the sensor, designated generally therein by the reference character 70. As shown, the sensor 70 includes multiple tines 72 at opposite ends of a connection path 74. As shown in FIG. 19, an upper sub-assembly overlies and is in substantial registration with a lower sub-assembly with one sub-assembly being formed from a first superconductor material SC1 and the other sub-assembly being formed from a second superconductor material SC2 with the distal or remote ends of the tines 72 connected together at 76. The detector D is positioned along the connection path 74 between the sub-assemblies.

Figure 20A:
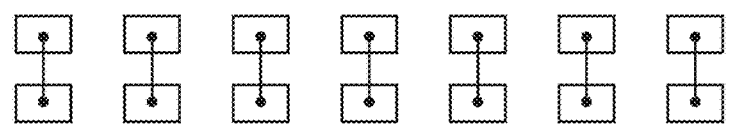
FIGS. 20A-20D represent different connection patterns.
Figure 20B:
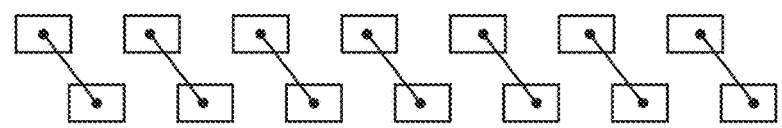
Figure 20C:
Figure 20D:
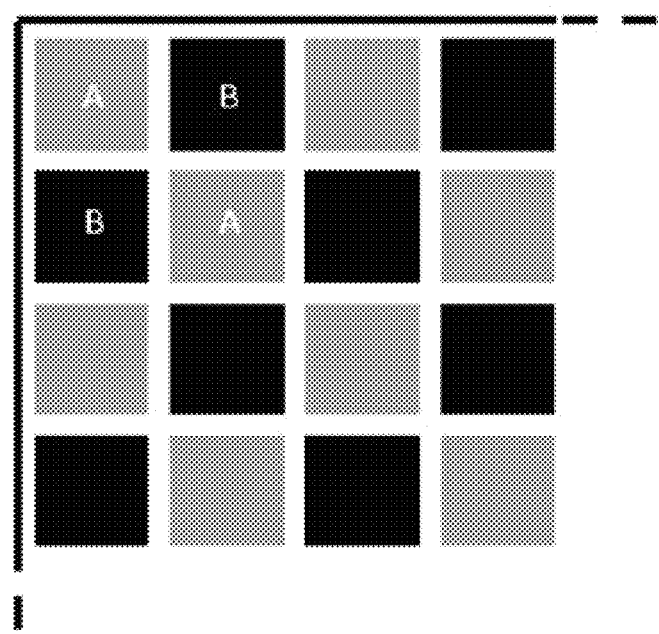

FIG. 20A illustrates a first connection pattern between the ends of the tines as shown in FIG. 19. In FIG. 20B, the tines of the first and second superconducting materials are offset from one another, and in FIG. 20C, the tines are both offset in interdigitated. FIG. 20D presents a row/column array of first and second superconducting materials "A" and "B" which interconnects are made to from loops.

The above-incorporated U.S. Provisional Application 61/877,261 filed Sep. 12, 2013 and U.S. Provisional Application 61/796,420 filed Nov. 10, 2012 disclose a configuration for an antenna type structure of superconductors "A" and "B" (as shown in FIGS. 21A and 21B) for detecting the $h_+$ and $h_x$ polarizations of gravitational waves. In the case of the $h_x$ configuration (FIG. 21B), when rotated, is capable of also detecting the $h_+$ gravitational wave (FIG. 21C).

The detection of the quadrupolar gravitational waves is dependent upon the gravitational wave potential on the distance from the center of mass of the antenna. However, the problem can be addressed by sufficiently large consecutive bimetallic structures as FIGS. 21A and 21B demonstrates the two possible polarizations of the gravitational wave.

Figure 22A:
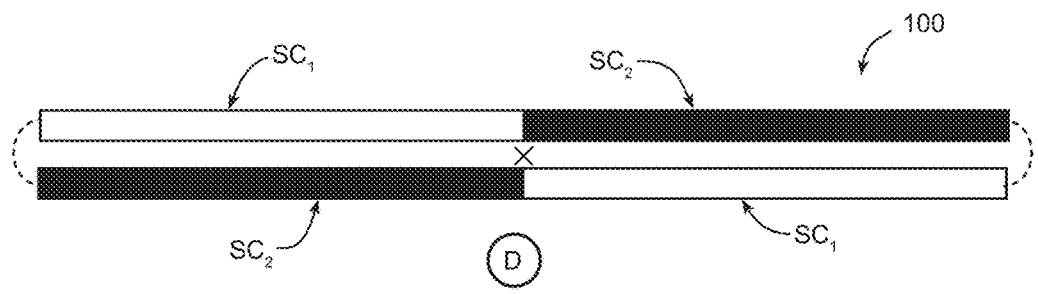
FIG. 22A presents a further embodiment and includes two spaced-apart longitudinally extending antenna.
Figure 22B:
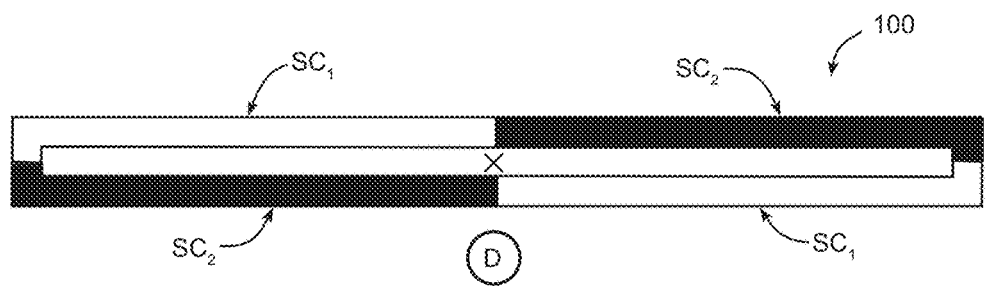
FIG. 22B illustrates the antenna of FIG. 22A as connected at their respective ends for form a loop.

FIG. 22A represents a further embodiment including two spaced-apart antenna each of which includes a first superconductor SC1, as represented by the solid black portion, and a second superconductor SC2 with ends of the two different materials joined, as represented by the dotted-lines in FIG. 22A, at their opposite ends as shown, or, as shown in FIG. 22B, by overlapping the two materials to form a continuous loop 100. Thus, the loop structure in FIG. 22A has four segments, i.e., the first superconductor SC1 segment followed by a second superconductor segment SC2, followed by a first superconductor SC2 segment, and followed by a second superconductor segment SC2 to close the loop 100.

As shown by the X symbol in FIGS. 22A and 22B, the loop 100 can be mounted for rotation about an axis that passes through the geometry of the loop 100 or, if desired, mounted for orbiting or revolution about another axis (not shown) that does not pass through the geometry of the loop 100.

As shown in FIGS. 22A and 22B, a detector D, such as the SQUID detector discussed above, can be positioned adjacent to or within the geometry of the loop 100 for measurement of any a magnetic fields or variations thereof produced by superconducting currents within the loop 100.

Figure 23:
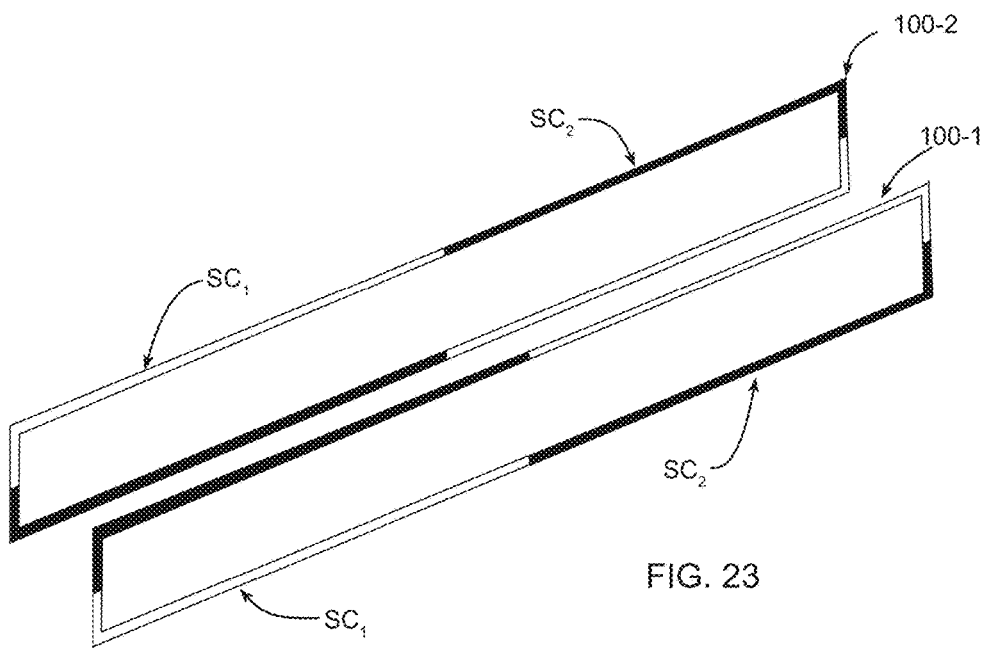
FIG. 23 is an isometric view of two loops of the type shown in FIG. 22B.
Figure 24:
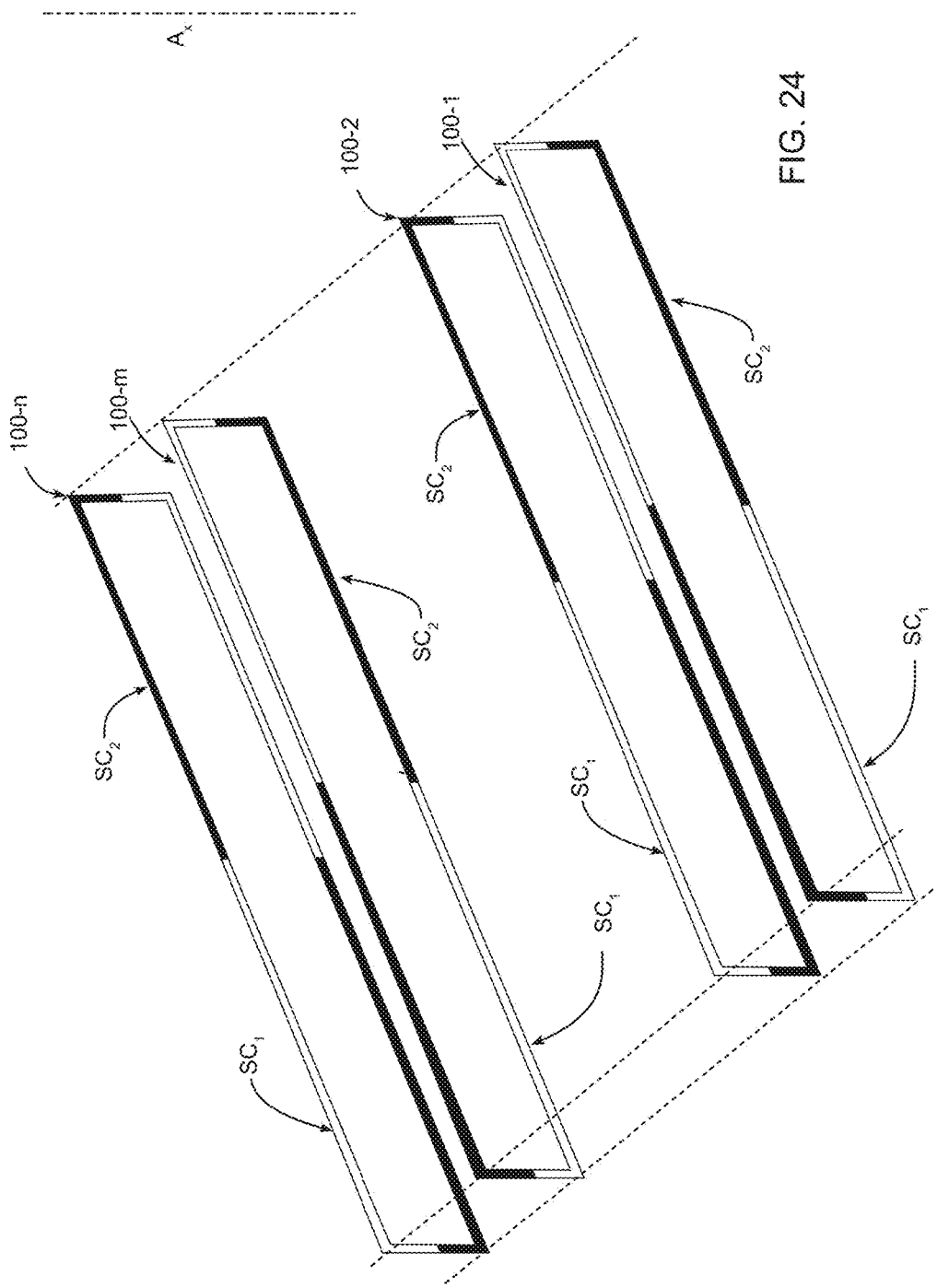
FIG. 24 is an isometric view of a plurality or a multitude of loops of the type shown in FIG. 22B.

FIG. 23 illustrates the organization of a dual-loop arrangement in which a first loop 100-1 is mounted adjacent to a second loop 100-2 to provide increased sensitivity. FIG. 24 illustrates the organization of a multi-loop arrangement in which a first loop 100-1 is mounted adjacent to a second loop 100-2, along with a multitude of successive loops terminating with loops 100-m and 100-n to provide a 'stacked' array of loops. The number of such loops can be large (i.e. $10^6$-$10^8$) to increase sensitivity. As in the case of FIGS. 22A and 22B, the loop array can be rotated about an axis that passes through the geometry of the array or revolved or orbited about an axis that does not pass through the geometry of the array, as represented in schematic form by the axis $A_x$ shown on the right in FIG. 24.

In the array shown in FIGS. 23 and 24, each first superconductor segment SC1 is interdigitated or interposed between each second superconductor segment SC2 and each second superconductor segment is interdigitated or interposed between each first superconductor segment SC1. As shown, each of the first superconductor segments SC1 of the loop 100-1 face a second superconductor segments SC2 of the loop 100-2, and, in a similar manner, each of the second superconductor segments SC2 of the loop 100-1 face a first superconductor segment SC1 of the loop 100-2 with this organizational sequence being maintained for all loops in the array.

While not shown in FIGS. 23 and 24, one or more detectors D can be associated with each array to sense magnetic fields generated consequent to superconducting currents in the various loops.

Figure 25:
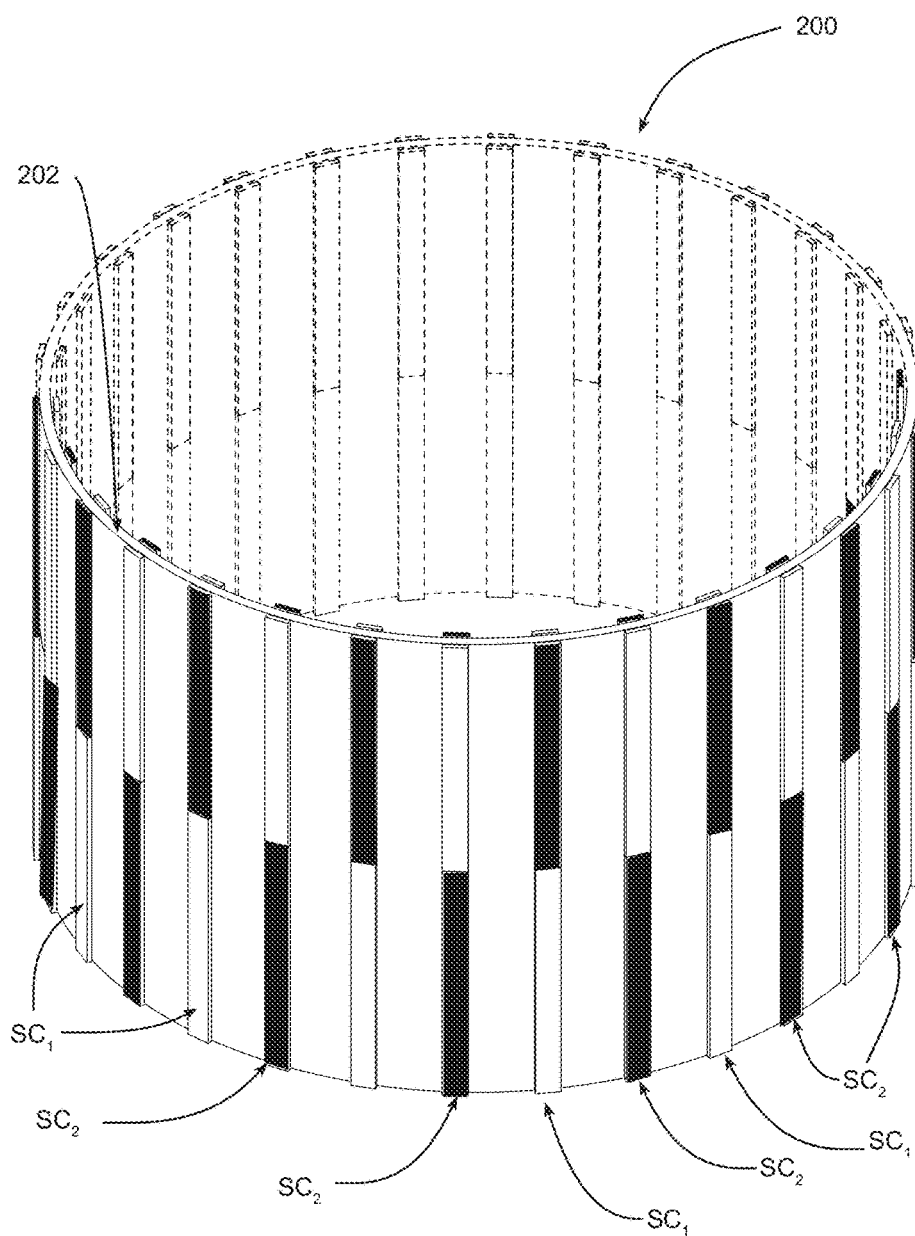
FIG. 25 is an isometric view of a detector array in which individual loops of the type shown in FIG. 23 are arrayed in a cylindrical pattern.
Figure 26:
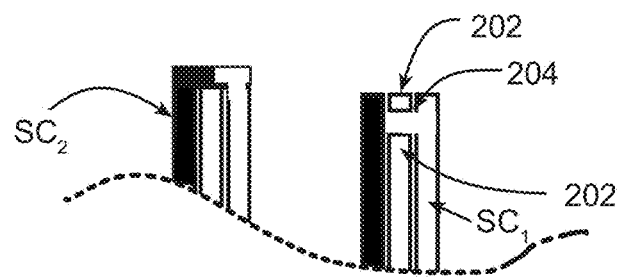
FIG. 26 illustrates different interconnection arrangements for the individual loops of the type shown in FIG. 23.

FIG. 25 illustrates another embodiment of a detector array. The detector array 200 includes a substrate 202 formed into a hollow cylinder with a plurality of loops 100 distributed about the cylindrical substrate, preferably at an equi-angluar distribution. In FIG. 25, the SC1/SC2 stripes not explicitly shown as connected at the respective bottom and top of the substrate 202. As shown in FIG. 26 on the left, the lower ends and the upper ends of the superconductor stripes can be connect by end caps 206 fabricated from both SC1 and SC2. In another arrangement, as shown on the right in FIG. 26, a "via" or similar aperture can be etched through (or formed by other techniques with the ends of the SC1/SC2 stripes interconnected therethrough.

Figure 27:
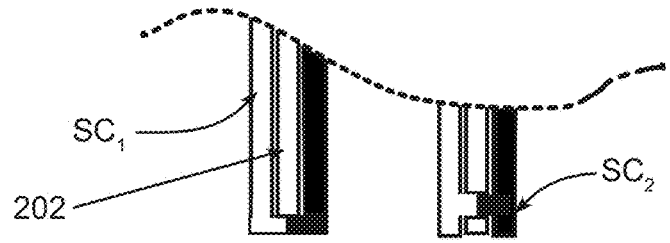
FIG. 27 illustrates the interdigitated pattern of sensing loops of FIG. 25.
Figure 27:
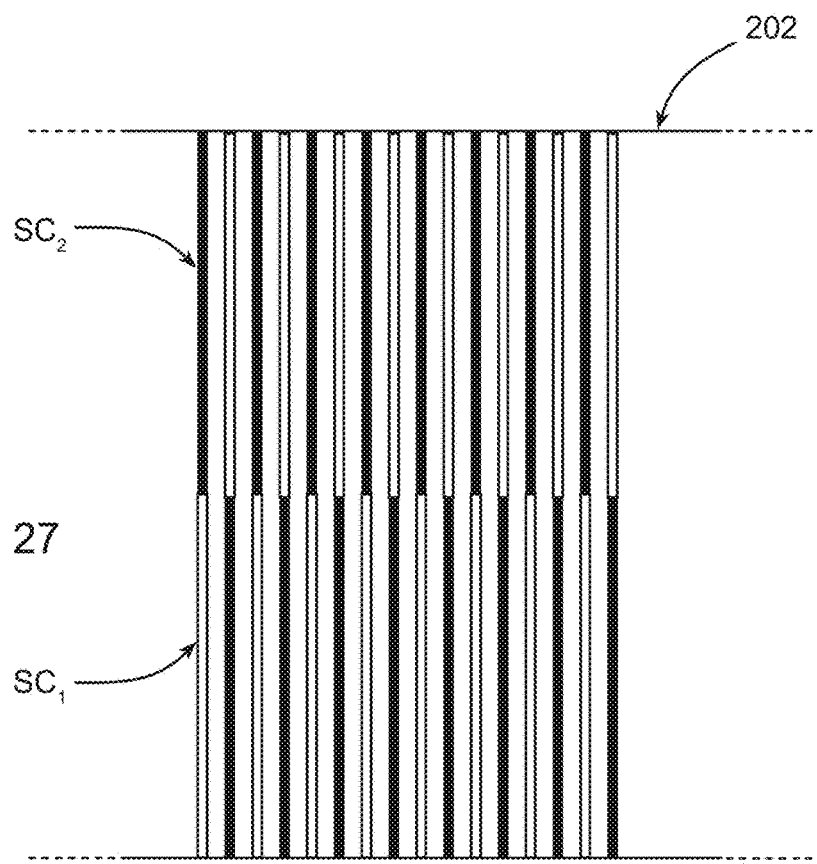

As shown in FIG. 27, the substrate 202 can be formed initially as a flat member upon which the various SC1/SC2 stripes are formed with their upper ends connected a shown, for example, in FIG. 26. Thereafter, the substrate 202 in formed into the cylindrical form shown in FIG. 26 with the edges thereof attached or secured together.

Figure 28:
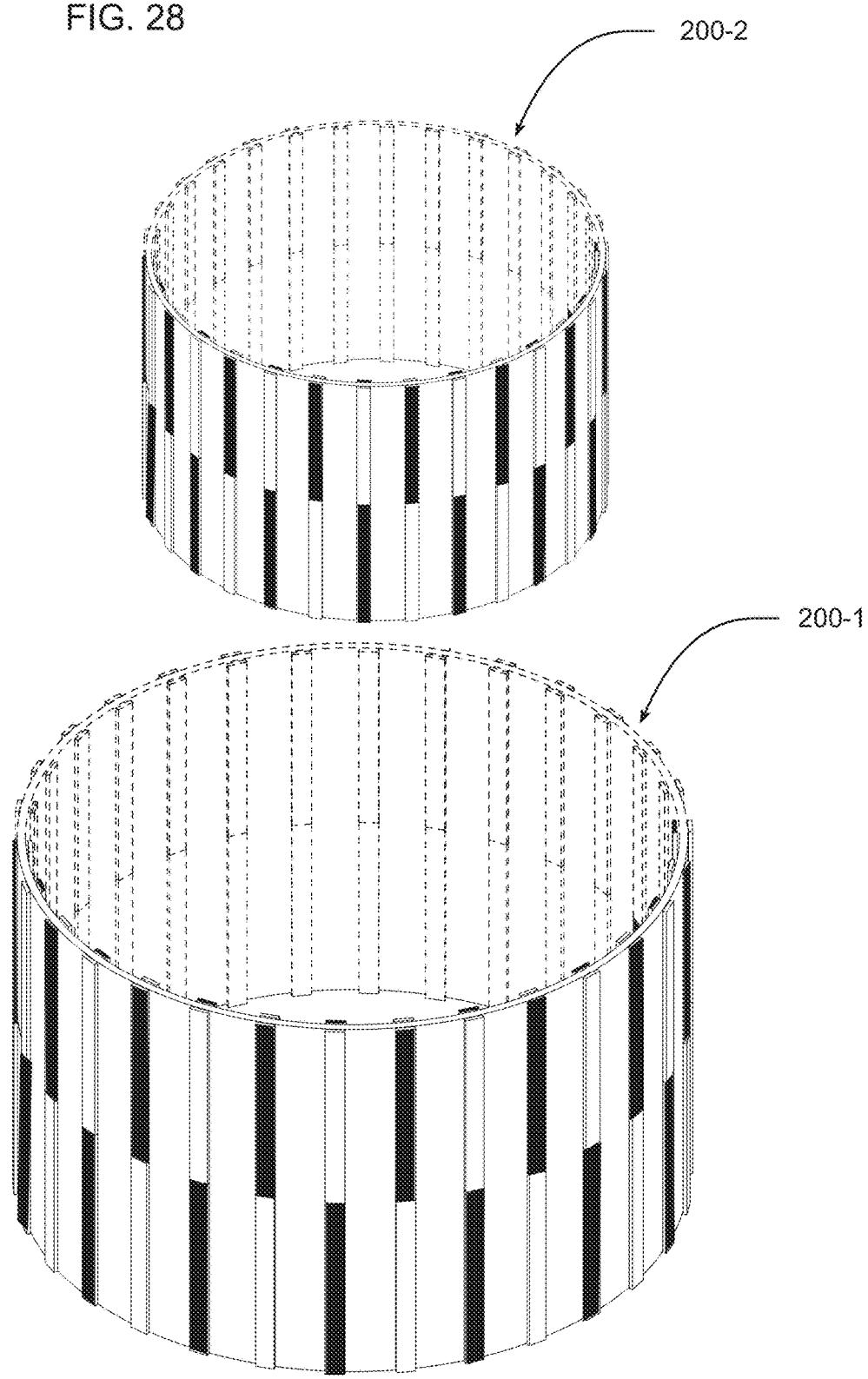
FIG. 28 illustrates the manner in which plural detector arrays of FIG. 25 can be nested together for increased sensitivity.

While FIG. 25 illustrates a single cylindrical detector array, further detector arrays can be nested therein. As shown in FIG. 28, a smaller diameter array 200-2 can be nested into the array 200-1 and even smaller diameter arrays 200-n (not shown) further nested there into. Additionally, a further detector array (not shown) having an inside diameter larger than the outside diameter of the detector array 200-1 can receive the detector array 200-1 and any detector arrays received therein.

In the various device disclosed above, the devices operate at cryogenic temperature depending upon that critical temperature $T_c$ at which the material become superconducting. While not shown, it is assumed that a supply of cryogenic liquid and the necessary storage tanks, cryogenic pumps, distribution conduits, controls, etc. are provided with the various detector devices to effect cooling below the critical temperature $T_c$ for the materials used. While also not shown, SQUID detection systems often are used in environments that are shielded (e.g., a mu-metal magnetic "bottle") from magnetic, electric, and electromagnetic fields, depending upon the particular application.

While many materials that exhibit superconductivity are known, the following table presents example superconductor densities for typical elemental superconductors.

TABLE

Table of example SC densities of typical elements

| Element | SC density | Difference from Nb | Summed with Nb | Product | n-factor |
|---|---|---|---|---|---|
| Nb Niobium | 5.56E+22 cm$^{-3}$ | | | | |
| Al Aluminum | 1.81E+23 cm$^{-3}$ | 1.25E+23 | 2.37E+23 | 1.01E+46 | 5.33E+45 |
| Sn Tin | 1.48E+23 cm$^{-3}$ | 9.24E+22 | 2.04E+23 | 8.23E+45 | 3.73E+45 |
| Pb Lead | 1.32E+23 cm$^{-3}$ | 7.64E+22 | 1.88E+23 | 7.34E+45 | 2.99E+45 |

Figure 6:
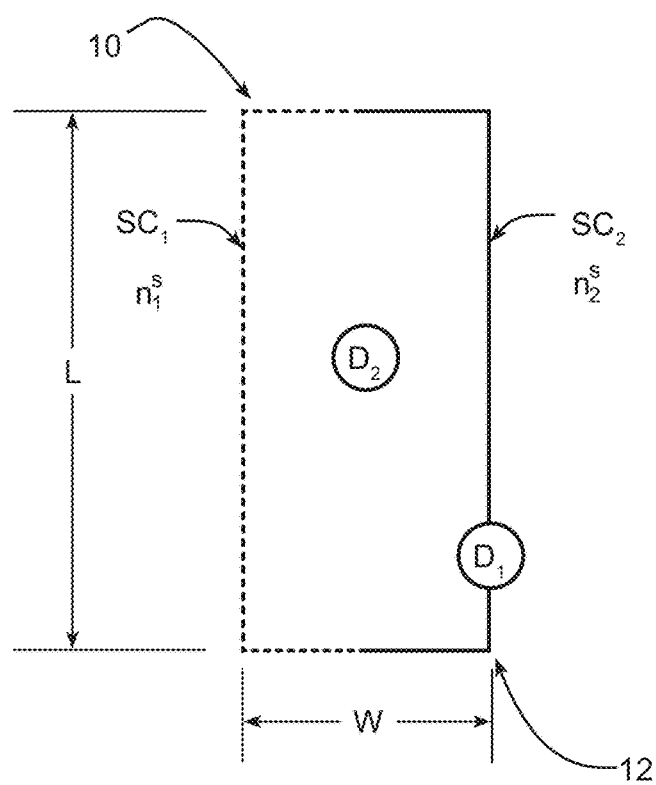
FIG. 6 is an idealized drawing of a basic single-axis accelerometer showing a superconducting loop having a length and a width.
Figure 7:
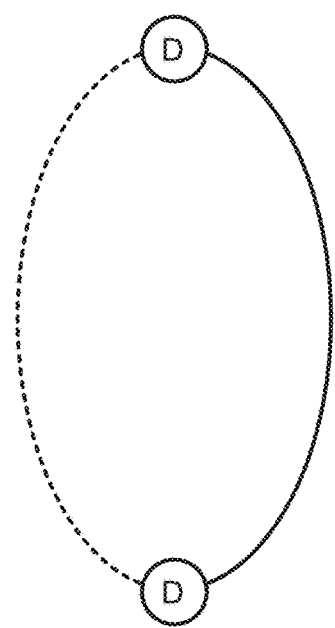
FIG. 7 is a variation of FIG. 6 and indicates that the superconductors can be curved or curvilinear.
Figure 8:
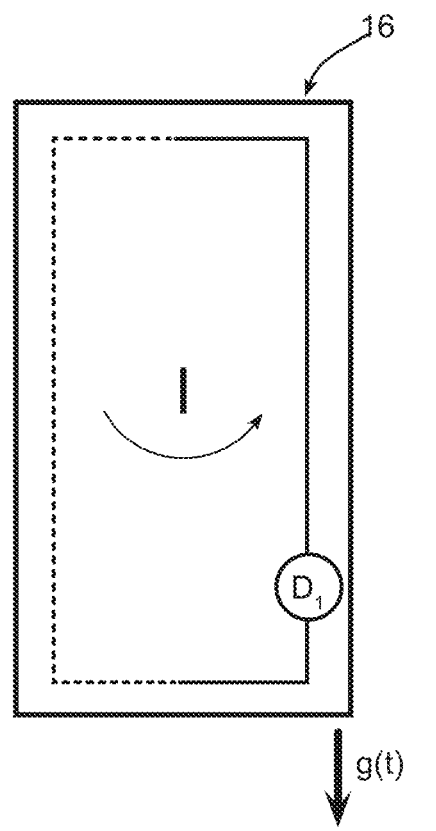
FIG. 8 illustrates an exemplary loop configuration attached to a mounting plate and subject to an acceleration force g(t)
Figure 9:
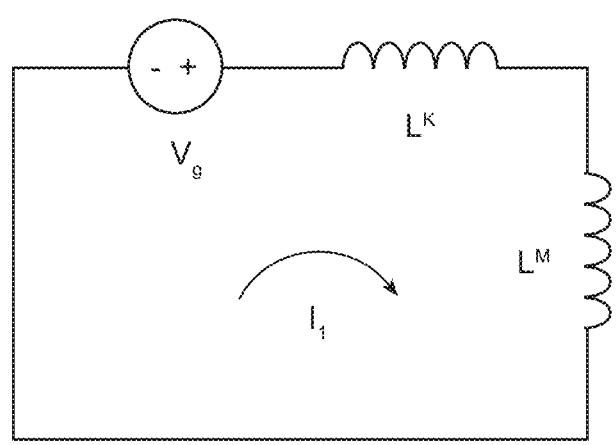
FIG. 9 illustrates an equivalent circuit for the configuration of FIG. 8.
Figure 10:
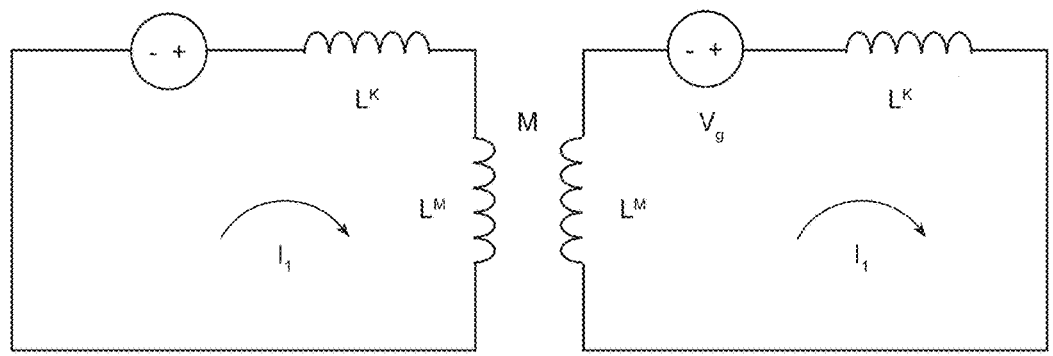
FIG. 10 illustrates an equivalent circuit for two magnetically coupled circuits of the type shown in FIG. 9.
Figure 11A:
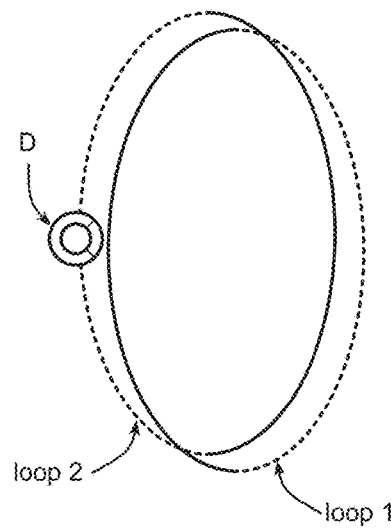
FIG. 11A is an idealized drawing of a dual-loop single-axis accelerometer.
Figure 11B:
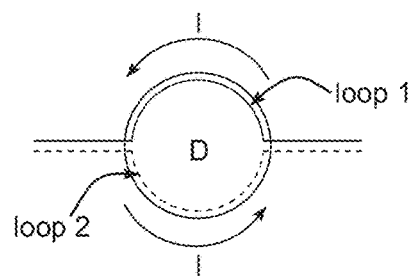
FIG. 11B is a detail view of loop portions in relationship to a detector.
Figure 29:
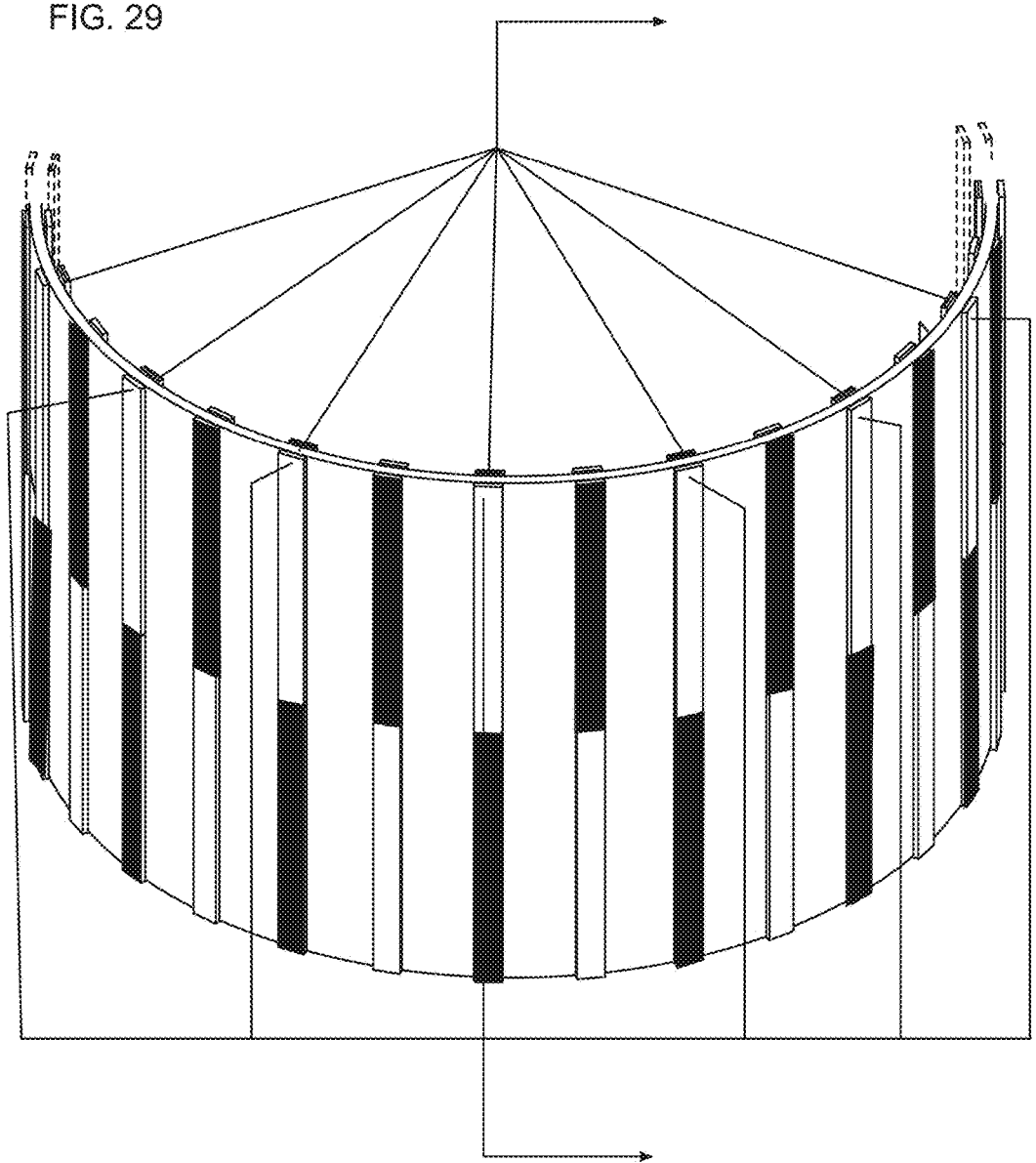
FIG. 29 illustrates an open loop connection circuit for the detector array of FIG. 25.

In the one preferred form of the various detector arrays, the various loops are closed current loops (of which FIG. 6 is an example) in which current within the loops is sensed via one or more SQUID sensors as described. In another preferred form of the various detector arrays, the loops are in-circuit with one another (as shown in FIG. 17E, for example. The closed current loop of the embodiment of FIGS. 25 and 26 can be configured as in-circuit with one another as shown in FIG. 29. While the circuit arrangement of FIG. 29 is intended to interface with a measuring device, a switch of the type shown in FIG. 4 can be used to periodically 'shunt' the sensing loops to provide transient current pulses representative of the transient charge redistribution.

As will be apparent to those skilled in the art, various changes and modifications may be made to the illustrated embodiment of the present invention without departing from the spirit and scope of the invention as determined in the appended claims and their legal equivalent.

The invention claimed is:

1. A device for detecting acceleration or changes in acceleration, comprising:
a closed uninterrupted electrical loop fabricated from two superconducting materials for supporting current flow therein having at least one first segment fabricated from a first superconducting material having a respective critical temperature $T_{c1}$ and at least one second segment fabricated from a second superconducting material, the second superconducting material different from the first superconducting material and having a respective critical temperature $T_{c2}$, each of the first and second superconducting materials having a different respective mobile electron distribution characteristic, the first segment connected at an end or end portion thereof to an end or end portion of the second segment via a material-to-material connection and another end or end portion of the first segment further connected to an other of end or end portion of the second segment via another material-to-material connection to define a closed electrical loop, each of the first and second mentioned material-to-material connections supporting electron flow therethrough when the electrical loop is at a temperature below the lower of the critical temperatures to support superconductivity therein;

an electron flow arising through at least one of the material-to-material connections in said electrical loop in response to acceleration or changes in acceleration when the electrical loop is at a temperature supporting superconductivity in the loop, acceleration or changes in acceleration changing the mobile electron distribution in each of the first and second superconducting material such that an unequal quantity of mobile electrons from each of the first and second superconducting materials reside on each side of the at least one material-to-material connection with electrons from the side have a greater quantity of electrons flowing through the material-to-material connection to the side thereof having a lower quantity of electrons; and a sensor for sensing electron flow in the closed electrical loop in response to electron flow induced therein by acceleration or changes in acceleration.

2. The device of claim 1, further comprising a plurality of said closed electrical loops and sensors.

3. The device of claim 1, where said sensor comprises a SQUID detector.

4. A device for detecting time-varying changes in gravity consequent to gravitational waves propagating through the device, comprising:

a closed uninterrupted electrical loop fabricated from two superconducting materials for supporting current flow therein having at least one first segment fabricated from a first superconducting material having a respective critical temperature $T_{c1}$ and at least one second segment fabricated from a second superconducting material, the second superconducting material different from the first superconducting material and having a respective critical temperature $T_{c2}$, each of the first and second superconducting materials having a different respective mobile electron distribution characteristic, the first segment connected at an end or end portion thereof to an end or end portion of the second segment via a material-to-material connection and another end or end portion of the first segment further connected to an other of end or end portion of the second segment via another material-to-material connection to define a closed uninterrupted electrical loop, each of the first and second mentioned material-to-material connections supporting electron flow therethrough when the electrical loop is at a temperature below the lower of the critical temperatures to support superconductivity therein;

an electron flow arising through at least one of the material-to-material connections in said electrical loop in response to acceleration or changes in acceleration thereof when the electrical loop is at a temperature supporting superconductivity in the loop, acceleration or changes in acceleration changing the mobile electron distribution in each of the first and second superconducting material such that an unequal quantity of mobile electrons from each of the first and second superconducting materials reside on each side of the at least one material-to-material connection with electrons from the side have a greater quantity of electrons flowing through the material-to-material connection to the side thereof having a lower quantity of electrons; and a sensor for sensing electron flow in the closed electrical loop in response to electron flow induced therein by time-varying changes in gravity consequent to gravitational waves propagating through the loop.

5. The device of claim 4, further comprising a plurality of said closed electrical loops and sensors.

6. The device of claim 4, where said sensor comprises a SQUID detector.

* * * * *